United States Patent
Ueno et al.

(10) Patent No.: US 8,023,539 B2
(45) Date of Patent: Sep. 20, 2011

(54) METHOD FOR DRIVING SURFACE EMITTING SEMICONDUCTOR LASER, OPTICAL TRANSMISSION MODULE, AND HANDHELD ELECTRONIC DEVICE

(75) Inventors: Osamu Ueno, Kanagawa (JP); Akira Sakamoto, Kanagawa (JP); Kazuhiro Sakai, Kanagawa (JP); Hideo Nakayama, Kanagawa (JP); Akemi Murakami, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 847 days.

(21) Appl. No.: 12/036,570

(22) Filed: Feb. 25, 2008

(65) Prior Publication Data
US 2009/0016732 A1    Jan. 15, 2009

(30) Foreign Application Priority Data
Jul. 13, 2007   (JP) .................................. 2007-183875

(51) Int. Cl.
*H01S 3/10*  (2006.01)
*H01S 3/13*  (2006.01)
*H01S 3/00*  (2006.01)

(52) U.S. Cl. .................. 372/26; 372/29.015; 372/38.02
(58) Field of Classification Search .................. 372/26, 372/29.015, 38.02, 38.07, 50.124
See application file for complete search history.

(56) References Cited

U.S. PATENT DOCUMENTS
| | | |
|---|---|---|
| 2002/0094004 A1 | 7/2002 | Furukawa |
| 2002/0167977 A1 | 11/2002 | Nakabayashi et al. |
| 2005/0201693 A1 | 9/2005 | Korenaga et al. |
| 2007/0032275 A1 | 2/2007 | Suzuki et al. |

FOREIGN PATENT DOCUMENTS
| | | |
|---|---|---|
| JP | 5-283791 | 10/1993 |
| JP | 2002-217491 | 8/2002 |
| JP | 2002-252407 | 9/2002 |
| JP | 2002-324939 | 11/2002 |
| JP | 2002-335038 | 11/2002 |
| JP | 2002-353568 | 12/2002 |
| JP | 2002-359433 | 12/2002 |
| JP | 2003-101127 | 4/2003 |
| JP | 2004-273584 | 9/2004 |
| JP | 2005-065076 | 3/2005 |
| JP | 2005-252334 | 9/2005 |
| JP | 2006-042307 | 2/2006 |

OTHER PUBLICATIONS

Piprek et al.; Harmonic Distortion in 1.55-μm Vertical-Cavity Lasers; Photonics Technology Letters, vol. 12, No. 12; Dec. 2000; pp. 1686-1688.

Carlsson et al.; Performance Characteristics of Buried Heterostructure VCSELs Using Semi-Insulating GaInP:Fe Regrowth; Journal of Quantum Electronics, vol. 37, No. 7; Jul. 2001; pp. 945-950.

Barrios et al.; GaAs/AlGaAs buried-heterostructure vertical-cavity surface-emitting laser with semi-Insulating GaInP:Fe regrowth; Electronics Letters, vol. 36, No. 18; Aug. 31, 2000.

Black et al.; Small-Signal Frequency Response of Long-Wavelength Vertical-Cavity Lasers; Photonics Technology Letters, vol. 13, No. 10; Oct. 2001; pp. 1049-1051.

Song et al.; 1.55-μm bottom-emitting InAlGaAs VCSELs with $Al_2O_3$/a-Si thin-film pairs as a top mirror; Lasers and Electro-Optics Society, 2004; pp. 410-411.

*Primary Examiner* — Armando Rodriguez
(74) *Attorney, Agent, or Firm* — Fildes & Outland, P.C.

(57) ABSTRACT

Provided is a method for driving a surface emitting semiconductor laser including an active region that generates light, a resonator structure disposed such that it sandwiches the active region, and a driving electrode that provides power to the active region. The surface emitting semiconductor laser has an internal resistance defined by voltage and current applied to the driving electrode. The method includes applying a modulation signal to the driving electrode, in which the modulation signal has a current amplitude defined by a first current value and a second current value that is greater than the first current value. The modulation signal is in a negative gradient region in which the internal resistance decreases in contrast to the increase of the current.

18 Claims, 7 Drawing Sheets

FIG. 1A    FIG. 1B    FIG. 1C

FIG. 2     20 Light sending device

FIG. 4     50 VCSEL

METHOD FOR DRIVING SURFACE EMITTING SEMICONDUCTOR LASER, OPTICAL TRANSMISSION MODULE, AND HANDHELD ELECTRONIC DEVICE

CROSS-REFERENCE TO RELATED APPLICATION

This application is based on and claims priority under 35 USC 119 from Japanese Patent Application No. 2007-183875 filed Jul. 13, 2007.

BACKGROUND

1. Technical Field

This invention relates to a method for driving a surface emitting semiconductor laser, an optical transmission module, and a handheld electronic device.

2. Related Art

For an optical transmission module that is modulated at a high speed in a gigahertz or higher frequency band, a surface emitting semiconductor laser (Vertical-Cavity Surface-Emitting Laser diode: hereinafter referred to as VCSEL) that is designed to have a small internal resistance is typically used. Some of single-mode VCSELs have an internal resistance of greater than 50 ohms; for example, an internal resistance of several hundred or several thousand ohms. However, such a high resistant VCSEL has a higher resistance than a resistance of, for example, 50 ohms, that is typically used for a driving circuit or wiring and thus causes impedance mismatching.

For devices, such as handheld devices, that are susceptible to electromagnetic noises, the use of an optical transmission module in which a VCSEL is used as a light source for signal transmission has been considered. A major technical difficulty therein is the reduction in power consumption of the VCSEL. One method for reducing power is to lower the threshold current of the VCSEL and reduce the driving current However, in general, if the threshold current is lowered, the internal resistance becomes high, and thus it becomes difficult to drive the VCSEL at a high speed.

The present invention addresses the issues of related arts described above, and aims to provide a method for driving a surface emitting semiconductor laser at a high speed while reducing power consumption.

The present invention further aims to provide an optical transmission module that is appropriate for reducing power consumption of handheld devices or the like.

SUMMARY

According to an aspect the invention, there is provided a method for driving a surface emitting semiconductor laser including an active region that generates light, a resonator structure disposed such that it sandwiches the active region, and a driving electrode that provides power to the active region. The surface emitting semiconductor laser has an internal resistance defined by voltage and current applied to the driving electrode. The method includes applying a modulation signal to the driving electrode, in which the modulation signal has a current amplitude defined by a first current value and a second current value that is greater than the first current value. The modulation signal is in a negative gradient region in which the internal resistance decreases in contrast to the increase of the current.

BRIEF DESCRIPTION OF THE DRAWINGS

Exemplary embodiments of the present invention will be described in detail based on the following figures, wherein.

DETAILED DESCRIPTION

Referring to the accompanying drawings, exemplary embodiments for implementing the present invention will be now described.

Figure 1A:
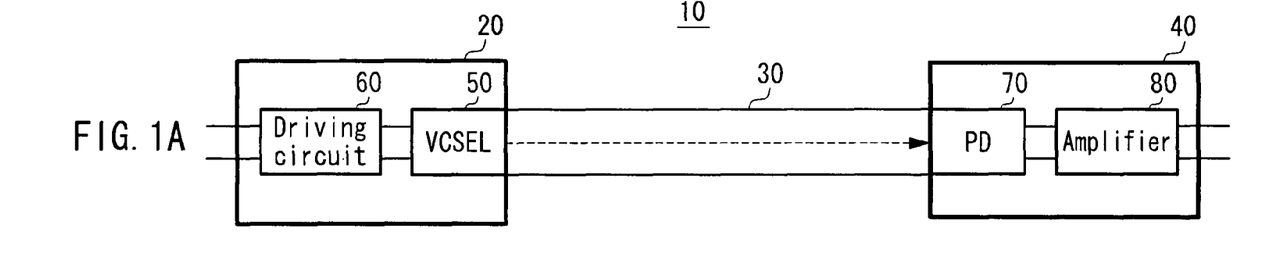
FIGS. 1A to 1C are schematic diagrams showing examples of a typical configuration of an optical transmission module according to an example of the present invention.
Figure 1B:
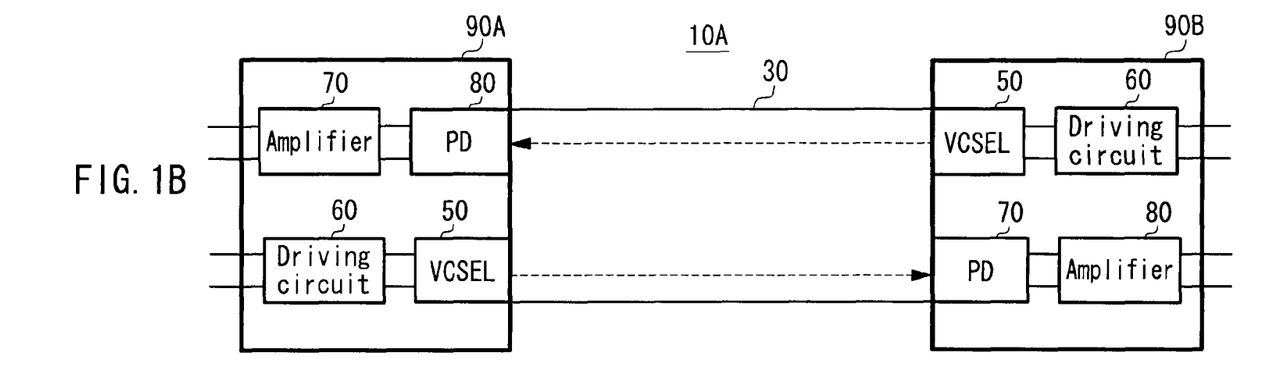
Figure 1C:
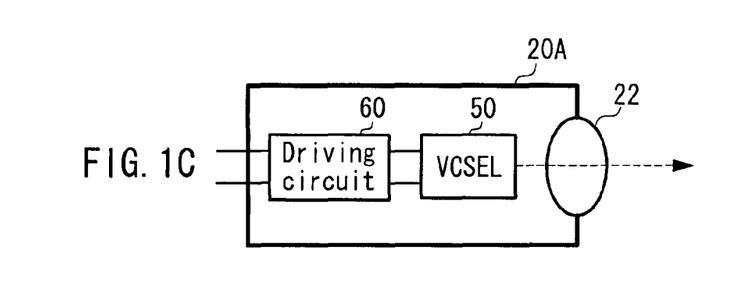

FIGS. 1A to 1C are schematic diagrams showing examples of a typical configuration of an optical transmission module according to an example of the present invention. As shown in FIG. 1A, an optical transmission module 10 is configured to include a light sending device 20 that sends an optical signal, an optical transmission medium 30 that transmits the sent optical signal, and a light receiving device 40 that receives the transmitted optical signal.

The light sending device 20 is capable of converting an electrical signal into an optical signal, and is configured to include a VCSEL 50, and a driving circuit 60 for driving the VCSEL 50. The VCSEL 50 emits laser light having a wavelength that corresponds to a transmission distance of the optical signal. In a case where the transmission distance is short, laser light of 850 nm, for example, may be outputted. The laser light may be either of single-mode or multi-mode. However, for a relatively short transmission distance, it is desirable to use multi-mode laser light.

The optical transmission medium 30 may be made of a light waveguide or an optical fiber or the like. In a case where multi-mode laser light is outputted from the VCSEL 50, a multi-mode POF (plastic optical fiber) or a multi-mode light waveguide may be used. If flexibility is required for the POF, it is desirable to use a multi-core POF.

The light receiving device 40 is capable of converting a transmitted optical signal into an electrical signal, and is configured to include a photo diode 70 that receives an optical signal and converts it into an electrical signal, and an amplifier 80 that amplifies the converted electrical signal. Instead of the photo diode 70, a phototransistor having an amplification function may be used.

An optical transmission module 10A shown in FIG. 1B is an example of an optical-electrical composite wiring that transmits optical signals in parallel. In this case, a light sending and receiving device 90A includes the VCSEL 50 and the driving circuit 60 for sending an optical signal, and further includes the photo diode 70 and the amplifier 80 for receiving an optical signal. Similarly, a light sending and receiving device 90B includes the VCSEL 50 and the driving circuit 60, and the photo diode 70 and the amplifier 80. In this case, the optical transmission medium 30 provides a transmission line for bi-directional optical transmission.

FIG. 1C illustrates another configuration example of the light sending device 20. A light sending device 20A may include an optical system 22, such as a lens or a mirror, which collects laser light that is outputted from the VCSEL 50. The configurations of the light sending device, the optical transmission medium, and the light receiving device shown in FIGS. 1A to 1C described above are provided for the purposes of illustration, and it is not intended that the present invention is limited to these examples.

In the optical transmission module described above, the VCSEL 50 may be a single-spot type VCSEL having a single light source, or a multi-spot type VCSEL having plural light sources. If a single-spot type VCSEL is used, an optical signal that is emitted from a single light source is serially transmitted. In contrast, if multi-spot type VCSEL arrays are used, optical signals emitted from plural light sources are transmitted in parallel. In a case where each of VCSEL arrays is driven at a different wavelength, the optical transmission medium 30 can perform multiple transmissions of optical signals.

Figure 2:
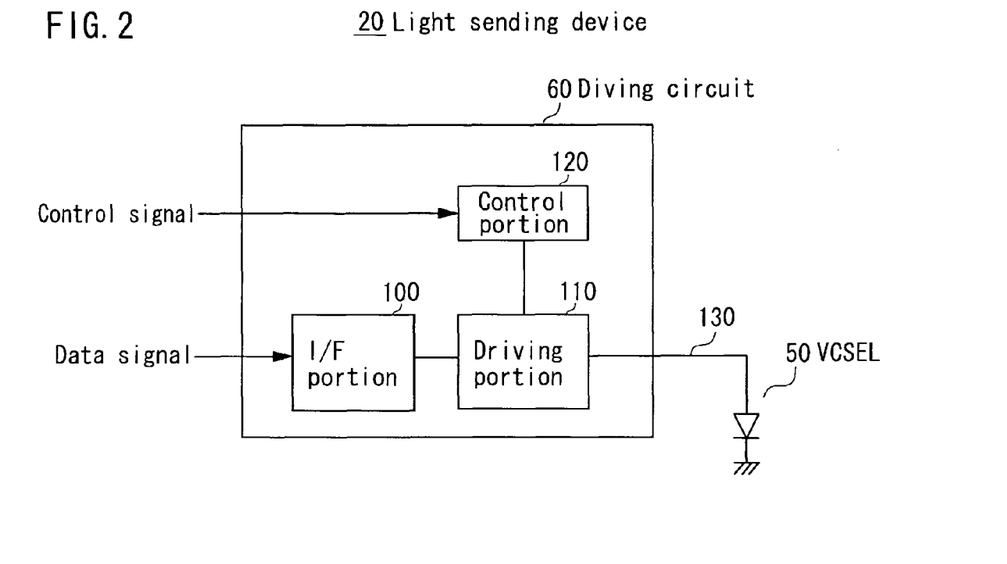
FIG. 2 illustrates a configuration of a light sending device.

FIG. 2 illustrates a configuration of a light sending device. The driving circuit 60 includes an interface (I/F) portion 100 that receives a data signal, a driving portion 110 that provides a driving current to the VCSEL 50 depending on a digital data signal received at the I/F portion 100, and a control portion 120 that controls the driving portion 110 based on a control signal or the like. If drive conditions of a VCSEL are to be varied depending on an ambient temperature, the control portion 120 may include a sensor that detects temperatures, and a memory in which drive conditions at each of the temperatures are defined. It is desirable to provide these components in a light module; however alternatively, it is possible to provide them externally to the light module and receive the conditions as a control signal. In addition, the control portion 120 may control such that the light output of a VCSEL stays constant. In this case, the control portion 120 monitors an output signal from a sensor that detects the light output of the VCSEL 50.

The driving portion 110 may be a typical current driving circuit, a voltage driving circuit, or a composite circuit thereof. In a case where the driving portion 110 is a current driving circuit, it applies a modulation signal that depends on a low level or high level of a received data signal via a transmission line 130 to the VCSEL 50. The frequency of the modulation signal to drive a VCSEL may be decided as appropriate depending on transmission speed or signal processing capability. The optical transmission module of an example of the present invention is capable of driving the VCSEL 50 at a high frequency equal to or higher than 1 GHz.

Figure 3A:
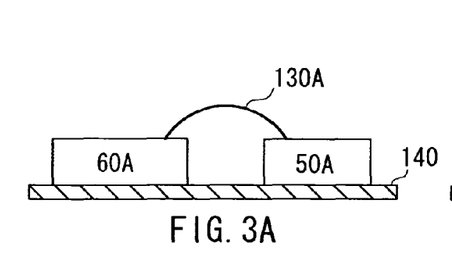
FIGS. 3A and 3B are diagrams showing implementation examples of a VCSEL and a driving circuit.

FIGS. 3A and 3B are diagrams showing implementation examples of a VCSEL and a driving circuit. As shown in FIG. 3A, a semiconductor element 50A that composes the VCSEL 50 and a semiconductor element 60A that composes the driving circuit 60 are mounted on a circuit board 140, and an electrode for an output of the semiconductor element 60A is coupled through a bonding wire 130A to a driving electrode of the semiconductor element 50A.

Figure 3B:
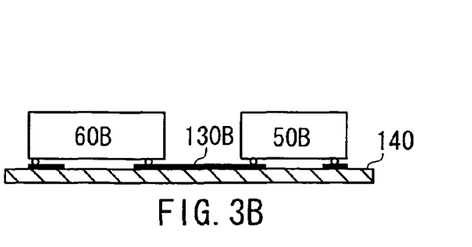

FIG. 3B is another implementation example. Semiconductor packages 50B and 60B, each respectively encapsulating the semiconductor element 50A and the semiconductor element 60A with a resin or ceramic, are mounted on the circuit board 140. For example, the semiconductor packages 50B and 60B may be mounted such that a bump electrode formed on a surface thereof is flip-chip mounted or face-down mounted onto a wiring pattern 130B of the circuit board 140. The bonding wire 130A or the wiring pattern 130B acts as the transmission line 130 from the driving circuit 60 to the VCSEL 50.

Figure 4:
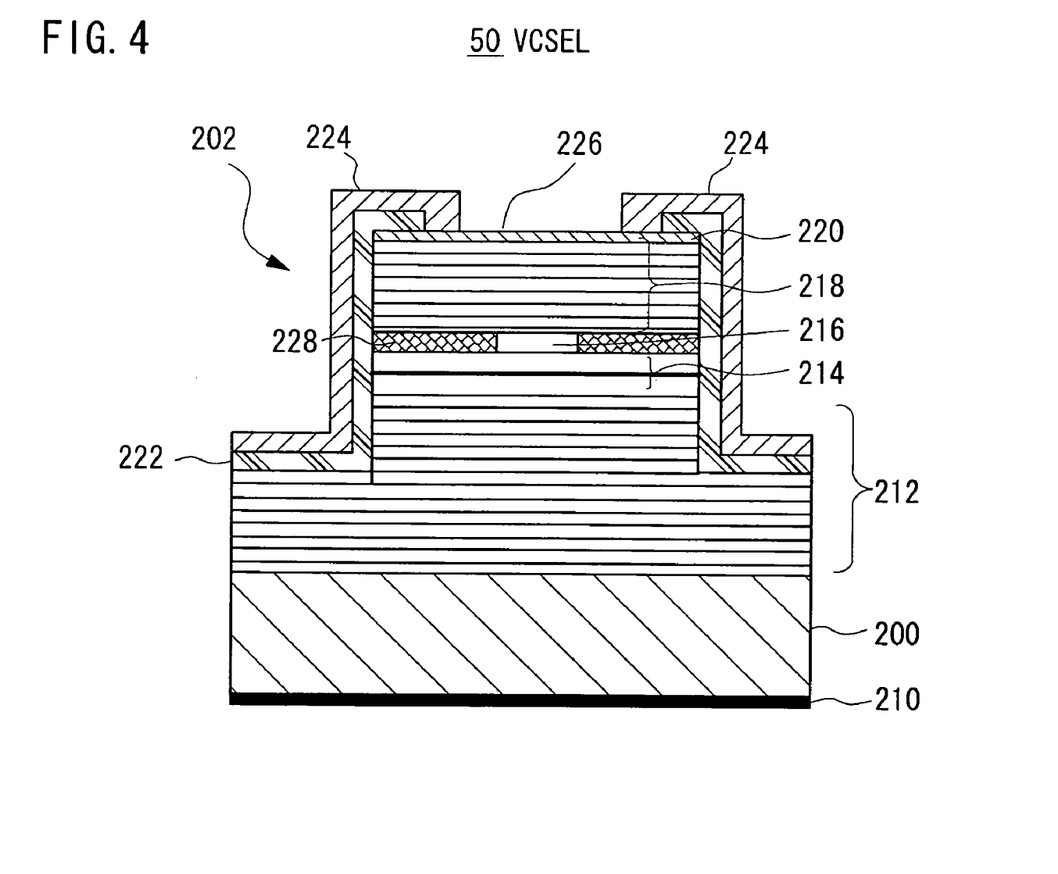
FIG. 4 is a cross sectional view showing a schematic configuration of a VCSEL.

A configuration example of a VCSEL used for an example is shown in FIG. 4 that shows a configuration of the VCSEL 50 in cross section. As shown in FIG. 4, on a GaAs substrate 200 on which an n-side lower electrode layer 210 is formed, semiconductor thin films are deposited on the order of an n-type lower semiconductor multilayer reflective mirror 212, an active region 214, a p-type AlAs layer 216, a p-type upper semiconductor multilayer reflective mirror 218. In the uppermost layer of the upper multilayer reflective mirror 218, a contact layer 220 made of p-type GaAs is formed. From the upper multilayer reflective mirror 218 to a portion of the lower multilayer reflective mirror 212, a cylindrical mesa 202 is formed. The mesa 202 is thermally processed under a high temperature vapor, and an oxidized region 228 is formed at a periphery of the AlAs layer 216 in the mesa 202, thereby a light confining region, which also acts as a current confining layer, is formed in the AlAs layer 216.

A bottom portion, a side surface, and a portion of a top portion of the mesa 202 are covered with an interlayer insulating film 222. At a top portion of the mesa 202, a contact hole is formed in the interlayer insulating film 222, and from above thereof, a p-side electrode layer 224 is ohmic-contacted to the contact layer 220. At a center potion of the p-side electrode layer 224, a round-shaped opening 226 for emitting laser light is formed.

The n-type lower semiconductor multilayer reflective mirror 212 may be formed by alternately stacking plural periods of, for example, $Al_{0.9}Ga_{0.1}As$ and $Al_{0.3}Ga_{0.7}As$, wherein the thickness of each layer is $\lambda/4n_r$ (where $\lambda$ is lasing wavelength, $n_z$ is refractive index of the medium.) The active region 214 may be made of, for example, an undoped lower $Al_{0.5}Ga_{0.5}As$ spacer layer, an undoped quantum well active layer, and an undoped upper $Al_{0.5}Ga_{0.5}As$ spacer layer. The p-type upper semiconductor multi-layer reflective mirror 218 may be formed by alternately stacking plural periods of, for example, $Al_{0.9}Ga_{0.1}As$ and $Al_{0.3}Ga_{0.7}As$, wherein the thickness of each layer is ¼ of the wavelength in the medium. In the lowermost layer of the upper semiconductor multilayer reflective mirror 218, the low resistant p-type AlAs layer 216 is contained. On the uppermost portion of the upper semiconductor multilayer reflective mirror 218, the p-type GaAs the contact layer 220, for example, having a carrier concentration of $1\times10^{19}$ cm$^{-3}$ is stacked. The p-side electrode layer 224 may be made of, for example, Au, and the n-side electrode layer 210 may be made of, for example, Au/Ge. The interlayer insulating film 222 may be made of, for example, SiNx. The VCSEL 50 shown in FIG. 4 is capable of outputting multi-mode laser light having a wavelength of about 850 nm.

Figure 5A:
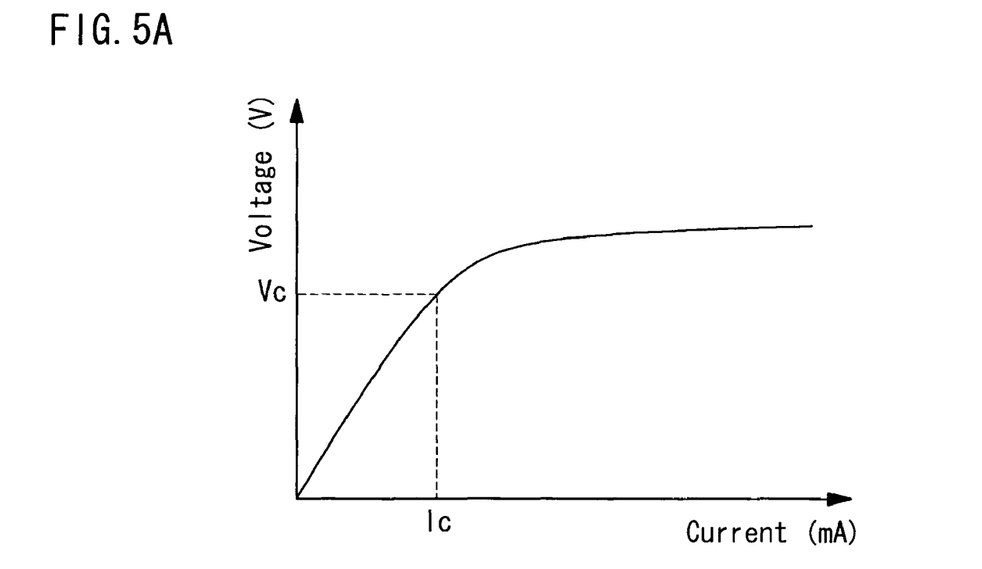
FIG. 5A is a graph showing the relation between the driving current and the driving voltage.
Figure 5B:
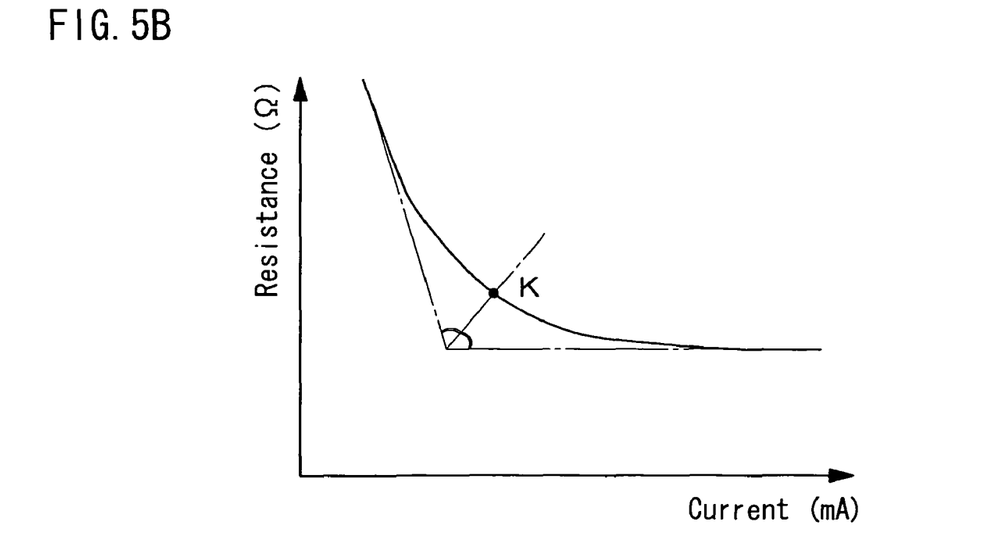
FIG. 5B is a graph showing the relation between the driving current and the internal resistance.

FIG. 5A is a graph showing the relation between the driving current (horizontal axis: mA) and the driving voltage (vertical axis: V) of a VCSEL. FIG. 5B is a graph showing the relation between the driving current (horizontal axis: mA) and the internal resistance (vertical axis: Ω) of a VCSEL. In a case where forward driving voltage and driving current are applied to the p-side electrode layer 224 and the n-side electrode layer 210 of a VCSEL, as shown in FIG. 5A, as the driving current increases up to a certain value Ic, approximately in proportion thereto, the driving voltage increases up to a certain value Vc. However, if the driving current goes beyond the certain value Ic, the variation of the driving voltage gradually becomes smaller, and tends toward saturation.

FIG. 5B shows the differentiation of the relation between the driving current and the driving voltage. In this specification, the resistance shown in FIG. 5B is defined as the internal resistance of a VCSEL. As obvious from FIG. 5B, when the driving current is small, the internal resistance of the VCSEL is extremely high, and as the driving current increases, the internal resistance decreases. When it goes beyond an inflection point K, the decrease in the internal resistance gradually becomes smaller, and tends toward saturation; wherein the inflection point K is a point in a section where the internal resistance changes from a steep decrease to saturation. As shown in FIG. 5B, when two asymptotes are provided near the region in which the resistance value saturates, the inflection point K is defined as a point at which a bisector whose vertex is an intersection of the asymptotes and the curve of the internal resistance intersects.

Figure 6:
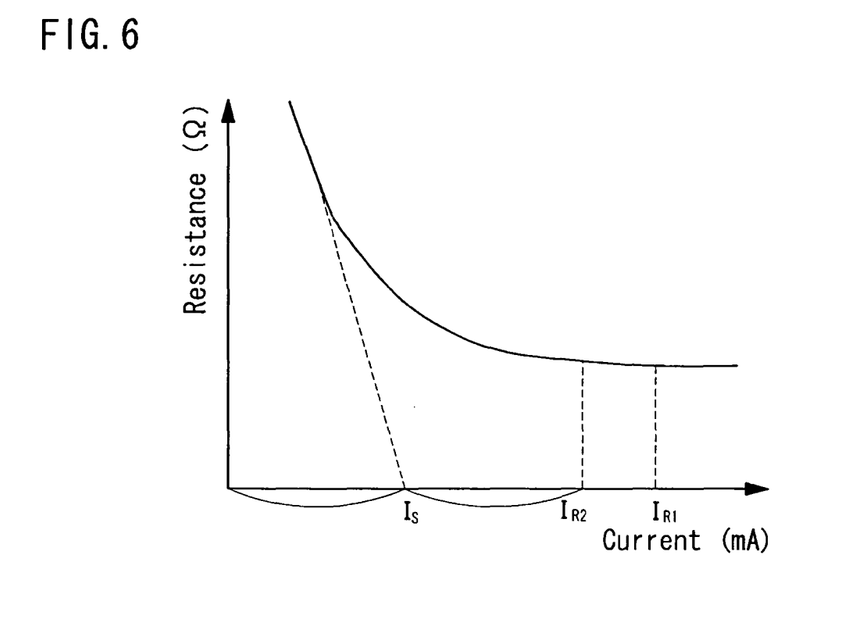
FIG. 6 is a graph illustrating a negative gradient region of the internal resistance.

A method for driving a VCSEL will be now described. An optical transmission module of an example of the present invention is characterized in that a VCSEL having an internal resistance of, typically, about 80 ohms to 250 ohms, is used and the VCSEL is modulation-driven such that the range of the current of a modulation signal is in a negative gradient region in which the internal resistance of the VCSEL decreases in contrast to the increase of current, with a minute current amplitude generally in the negative gradient region. FIG. 6 is a graph illustrating a negative gradient region. The negative gradient region is a current region in which the current dependency of the internal resistance of a VCSEL has a negative gradient, and the range of the negative gradient region at this time is indicated as a current value $I_{R1}$. More preferably, the negative gradient region is in a range to a current value $I_{R2}$, at which the current dependency appears prominently, and is equal to or less than twice of a current value $I_S$, around which contacts with an early negative gradient.

Figure 7:
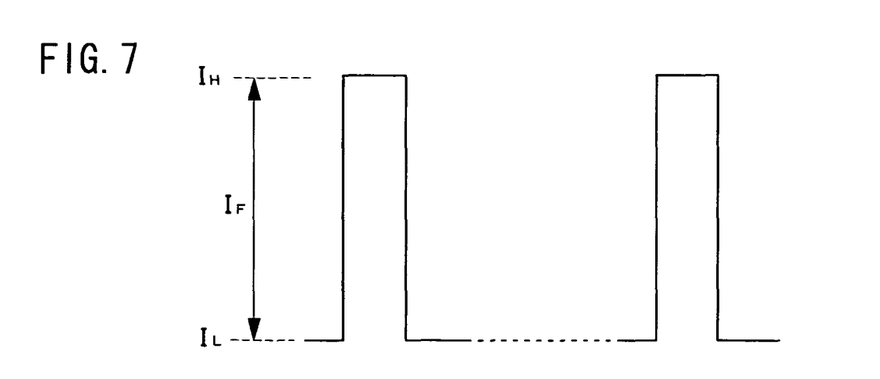
FIG. 7 illustrates a waveform of a modulation signal.

FIG. 7 is a waveform of a modulation signal when a VCSEL is driven. The modulation signal has a current amplitude $I_F$, which is defined by a low level current value $I_L$ and a high-level current value $I_H$. In an example of the present invention, the low level current value $I_L$ and the high-level current value $I_H$ are set to be in the negative gradient region shown in FIG. 6. This setting is made by the control portion 120 of the driving circuit 60, and the driving circuit 60 provides the modulation signal shown in FIG. 7 through the transmission line 130 to the VCSEL 50.

Figure 8A:
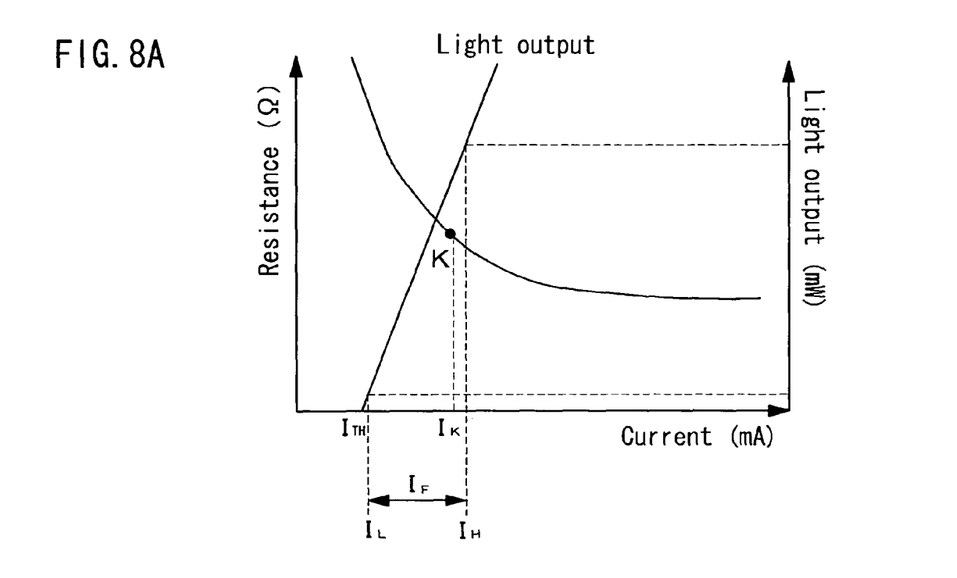
FIG. 8A shows a method for driving a VCSEL of an example of the present invention.
Figure 8B:
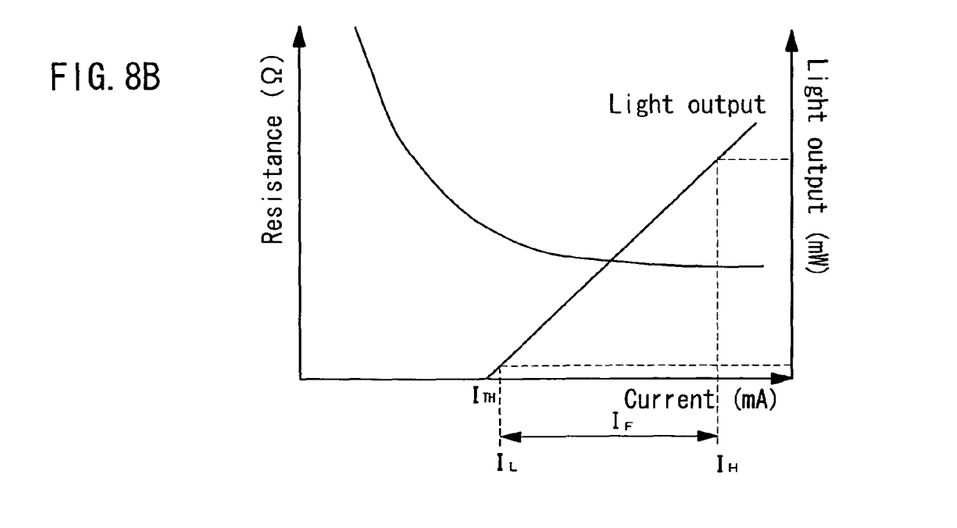
FIG. 8B shows a method for driving a VCSEL of a related art.

FIG. 8A shows a method for driving a VCSEL of an example of the present invention, and FIG. 8B illustrates a method for driving a VCSEL of a related art. In these drawings, in addition to the relation between the driving current and the internal resistance, the relation between the driving current and the light output are shown. Characteristics of the VCSEL of the example and those of the VCSEL of the related art will now be compared. It can be found that a threshold current $I_{TH}$ of the VCSEL of this example is set to be smaller than that of the related art. In addition, in the VCSEL of this example, the gradient (slope efficiency) of the light output with respect to the driving current is made higher than that of the VCSEL of the related art. A desired threshold value and slope efficiency can be selected by changing a structure, such as an aperture diameter of the current confining layer 216 of the VCSEL, as appropriate. It is desirable that the slope efficiency is, for example, equal to or greater than 0.5 W/A.

As described above, the modulation signal of this example is set to be in a negative gradient region of the internal resistance, as shown in FIG. 8A. Preferably, the range of the current amplitude $I_F$ between the low-level current value $I_L$ and the high-level current value $I_H$ is equal to or less than 2 mA, and the low-level current value $I_L$ is smaller than the current value at the inflection point K $I_K$ of the internal resistance. The low-level current value $I_L$ may be slightly greater than the threshold current $I_{TH}$. The purpose thereof is to enhance responsivity when the VCSEL is driven at a high speed, and the light output at this point is extremely small. The high-level current value $I_H$ is greater than the current value at the inflection point K $I_K$, and preferably, smaller than the current value $I_{R2}$ shown in FIG. 6. The internal resistance at the low-level current value $I_L$ is equal to or greater than about 80 ohms.

On the other hand, in the method for driving a VCSEL of a related art, the modulation signal is not set to be in the negative gradient region of the internal resistance, as shown in FIG. 8B. That is, the low-level current value $I_L$ and the high level of the current value $I_H$ of the modulation signal is in a region in which a hyperbola of the internal resistance approximately saturates, in other words, the difference in the internal resistance between at the low-level current value $I_L$ and at the high-level current value $I_H$ is not substantially observed. In addition, the slope efficiency of the VCSEL is made smaller, and the current amplitude $I_F$ between the low-level current value $I_L$ and the high-level current value $I_H$ is greater than that of this example and is about 5 mA.

According to a driving method of this example, by using a VCSEL having an internal resistance of above 50 ohms, or typically, equal to or greater than 80 ohms, instead of a VCSEL having an internal resistance equal to or smaller than 50 ohms that has been required for high-speed driving in a related art, a VCSEL having a low threshold value and high slope efficiency can be achieved, and the VCSEL can be driven with a low current. In a related art, when such a VCSEL is driven with a large amplitude current in a region in which the internal resistance saturates, it has been difficult to drive the VCSEL at high speed. However, in an example of the invention, high-speed driving can be achieved because current driving in the negative gradient region of the internal resistance is made with a small amplitude.

When a signal is modulated from the low-level current value $I_L$ to the high-level current value $I_H$, the internal resistance value decreases with the increase of the current, and thus current flows more easily than in a saturation region in which the gradient is zero, and jitters at rising edges become less likely to occur, which enables high-speed modulation. On the other hand, when a signal is modulated from the high-level current value $I_H$ to the low-level current value $I_L$, the internal resistance near the high level at which light is emitted is relatively low, and thus light modulation at a relatively high speed can be performed. In addition, the modulation range of the current value is limited within a minute region in a negative gradient region, and thus high-speed modulation can be performed even when the internal resistance is generally high. It is desirable that there is a difference of equal to or greater than 20% between the internal resistance at the high-level current value $I_H$ and the internal resistance at the low-level current value $I_L$.

Figure 9:
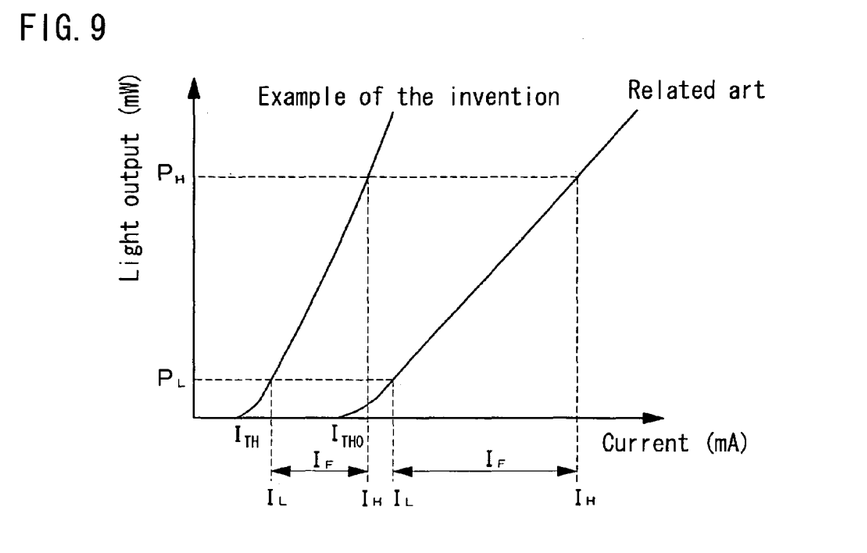
FIG. 9 is a diagram for comparing the relation between the current and the light output of an example of the present invention and a VCSEL of a related art.

FIG. 9 illustrates characteristics of a VCSEL of an example of the invention and a VCSEL, of a related art, in further detail, and indicates the driving current on the horizontal axis and the light output on the vertical axis. As described above, when a modulation signal of the VCSEL of this example is set to be in a negative gradient region, the negative gradient region exists in a range that includes a threshold current $I_{TH}$, and thus an average current value during modulation is also low current near the threshold current $I_{TH}$, which enables power reduction.

The threshold current $I_{TH}$ of the VCSEL of this example is smaller than a threshold current $I_{TH0}$ of the related art, and thus power reduction can be achieved from this aspect. Moreover, if the current amplitude range is simply lowered, it would adversely reduce the amount of emission light; however, by increasing the slope efficiency, it is possible to compensate for this reduction. In FIG. 9, the light output during modulation is indicated with $P_H$ and $P_L$, and the slope efficiency of the VCSEL of this example is made large such that the light output becomes as same as that of the VCSEL of the related art. With such a configuration, even when low-power driving is performed, a sufficient light amount of an optical signal can be obtained.

In general, when the internal resistance of a VCSEL is equal to or greater than 80 ohms, the effects of impedance mismatching or stray capacitances are of concern; however, such adverse effects can be minimized by making the distance from the driving circuit 60 to a light emission point of the VCSEL 50 (the transmission line 130) equal to or less than 2 mm.

Figure 10:
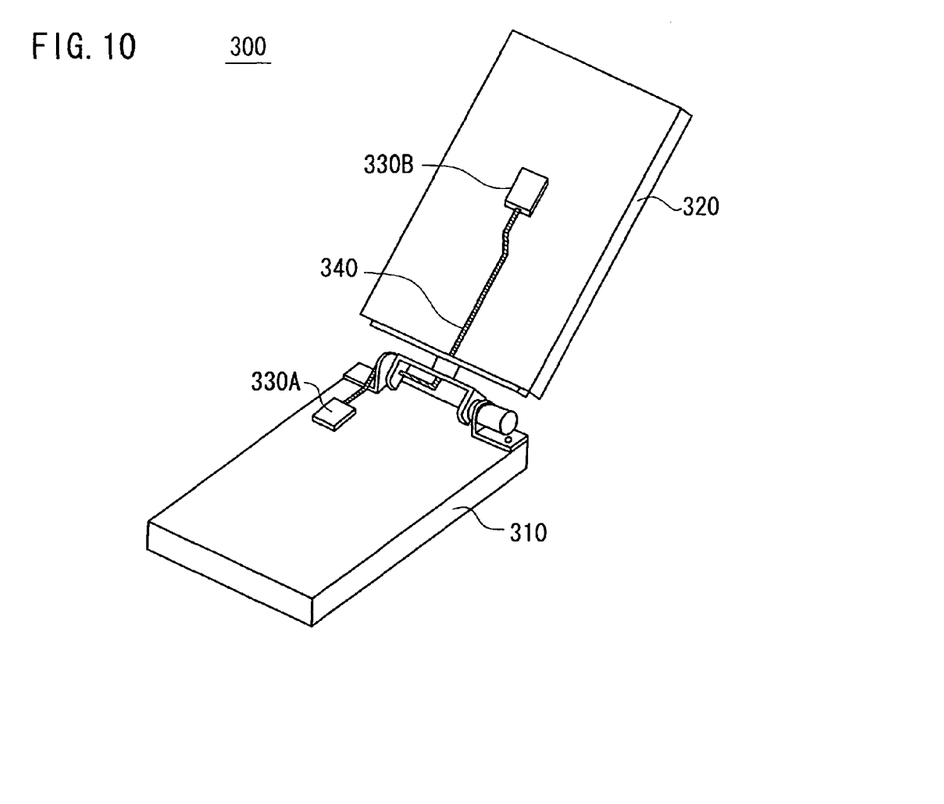
FIG. 10 illustrates a schematic configuration of a mobile phone to which an optical transmission system of an example is applied.

FIG. 10 illustrates a schematic configuration of a mobile phone to which an optical transmission system of an example of the present invention is applied. A mobile phone 300 includes a body portion 310 on a surface of which operating buttons or the like are disposed, and a display portion 320 rotatably mounted through a hinge to the body portion 310. In the mobile phone 300, an optical transmission module as shown in FIG. 1B is mounted. In the body portion 310, a light sending and receiving device 330A is provided, and in the display portion 320, a light sending and receiving device 330B is provided. The light sending and receiving devices 330A and 330b are coupled through a flexible optical fiber 340. The light sending and receiving device 330A sends image data or the like to be displayed on the display portion 320 to the light sending and receiving device 330B. On the other hand, the light sending and receiving device 330B sends image data taken with an imaging camera or the like to the light sending and receiving device 330A.

Preferably, a VCSEL emits multi-mode laser light having a wavelength of 850 nm, and the transmission line 130 from the driving circuit 60 to the VCSEL is equal to or less than 2 mm. The optical fiber 340 uses a POF, and the length thereof is equal to or less than 30 cm. The driving circuit 60 of the light sending and receiving devices 330A and 330B drives the VCSEL at a high frequency of equal to or greater than 1 GHz.

In a mobile phone or the like, a microstrip antenna for receiving and sending a wireless signal is mounted, and electromagnetic noises generated by the antenna may adversely affect an electrical signal. As in an example of the invention, by transmitting an optical signal whose light source is a VCSEL, the effects of electromagnetic noises or the like from the antenna can be minimized.

An optical transmission module of the present invention can be especially effectively used, not only for a mobile phone as described above, but also for electronic devices such as a PDA (personal digital assistant), a laptop or notebook personal computer, or a game console. The optical transmission module of the present invention can be used, not only for signal transmission within an electronic device, but also for signal transmission between an electronic device and an other external electronic device.

While the exemplary embodiments of the present invention have been described in detail, the invention is not limited to these specific exemplary embodiments, and various modifications and changes can be made without departing from the scope of she invention as set forth herein.

What is claimed is:

1. A method for driving a surface emitting semiconductor laser comprising an active region that generates light, a resonator structure disposed such that it sandwiches the active region, and a driving electrode that provides power to the active region, the surface emitting semiconductor laser having an internal resistance defined by voltage and current applied to the driving electrode, the method comprising applying a modulation signal to the driving electrode, the modulation signal having a current amplitude defined by a first current value and a second current value that is greater than the first current value, the modulation signal being in a negative gradient region in which the internal resistance decreases in contrast to the increase of the current applied to the driving electrode.

2. The driving method according to claim 1, wherein the internal resistance is defined by differentiating the relation between the applied voltage and current.

3. The driving method according to claim 1, wherein the first current value is less than an inflection point at which the decrease of the internal resistance tends toward saturation.

4. The driving method according to claim 3, wherein the first current value is greater than a threshold current of the surface emitting semiconductor laser.

5. The driving method according to claim 1, wherein the second current value is greater than an inflection point of the internal resistance.

6. The driving method according to claim 1, wherein the current amplitude is equal to or less than 2 mA.

7. The driving method according to claim 6, wherein the frequency of the modulation signal is equal to or greater than 1 GHz.

8. The driving method according to claim 6, wherein the distance of a transmission line that couples a driving circuit that outputs the modulation signal and a driving electrode of the surface emitting semiconductor laser is equal to or less than 2 mm.

9. The driving method according to claim 8, wherein a first internal resistance that corresponds to the first current value is higher than the resistance of the transmission line.

10. The driving method according to claim 1, wherein the internal resistance is at least 80 ohms.

11. The driving method according to claim 1, wherein the difference between the value of the internal resistance at the first current value and the value, of the internal resistance at the second current value is equal to or greater than 20%.

12. An optical transmission module comprising:

a light sending device that includes a surface emitting semiconductor laser and a driving circuit driving the surface emitting semiconductor laser and sends an optical signal by the driving of the surface emitting semiconductor laser;

an optical transmission medium that transmits the optical signal sent from the light sending device; and a light receiving device that receives the optical signal transmitted by the optical transmission medium, the surface emitting semiconductor laser comprising an active region that generates light, a resonator structure disposed such that it sandwiches the active region, and a driving electrode that provides power to the active region, the surface emitting semiconductor laser having an internal resistance defined by voltage and current applied to the driving electrode, the driving circuit applying a modulation signal to the driving electrode, the modulation signal having a current amplitude defined by a first current value and a second current value that is greater than the first current value, and the modulation signal being in a negative gradient region in which the internal resistance decreases in contrast to the increase of the current.

13. The optical transmission module according to claim 12, wherein the driving circuit provides a modulation signal of at least 1 GHz to the surface emitting semiconductor laser, and the current amplitude of the modulation signal is equal to or less than 2 mA.

14. The optical transmission module according to claim 13, wherein the distance of a transmission line that couples, the driving circuit and a driving electrode of the surface emitting semiconductor laser is equal to or less than 2 mm, and the length of the optical transmission medium is equal to or less than about 30 cm.

15. The optical transmission module according to claim 12, wherein the surface emitting semiconductor laser outputs multi-mode laser light, and the optical transmission medium is a multi-mode optical transmission medium.

16. The optical transmission module according to claim 12, wherein the internal resistance is at least 80 ohms.

17. A handheld electronic device comprising an optical transmission module,
the optical transmission module comprising:
a light sending device that includes a surface emitting semiconductor laser and a driving circuit driving the surface emitting semiconductor laser and sends an optical signal by the driving of the surface emitting semiconductor laser,
an optical transmission medium that transmits the optical signal sent from the light sending device; and
a light receiving device that receives the optical signal transmitted by the optical transmission medium,
the surface emitting semiconductor laser comprising an active region that generates light, a resonator structure disposed such that it sandwiches the active region, and a driving electrode that provides power to the active region, the surface emitting semiconductor laser having an internal resistance defined by voltage and current applied to the driving electrode,
the driving circuit applying a modulation signal to the driving electrode, the modulation signal having a current amplitude defined by a first current value and a second current value that is greater than the first current value, and the modulation signal being in a negative gradient region in which the internal resistance decreases in contrast to the increase of the current.

18. The handheld electronic device according to claim 17, wherein the handheld electronic device comprises a body portion and a display portion coupled through a coupling portion to the body portion, and the body portion comprises a light sending device, and the display portion comprises a light receiving device, and the optical transmission medium passes through the coupling portion.

\* \* \* \* \*